(12) United States Patent
Dhindsa et al.

(10) Patent No.: US 8,900,398 B2
(45) Date of Patent: Dec. 2, 2014

(54) LOCAL PLASMA CONFINEMENT AND PRESSURE CONTROL ARRANGEMENT AND METHODS THEREOF

(75) Inventors: Rajinder Dhindsa, San Jose, CA (US); Michael C. Kellogg, Dublin, CA (US); Babak Kadkhodayan, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 645 days.

(21) Appl. No.: 12/872,982

(22) Filed: Aug. 31, 2010

(65) Prior Publication Data

US 2011/0108524 A1 May 12, 2011

Related U.S. Application Data

(60) Provisional application No. 61/238,665, filed on Aug. 31, 2009, provisional application No. 61/238,656, filed on Aug. 31, 2009.

(51) Int. Cl.
*H01L 21/3065* (2006.01)
*H01J 37/32* (2006.01)

(52) U.S. Cl.
CPC ..... *H01J 37/32642* (2013.01); *H01J 37/32623* (2013.01)
USPC .............. 156/345.1; 156/345.36; 156/345.35; 156/345.47; 156/345.38; 118/715; 216/59

(58) Field of Classification Search
CPC .............. C23C 14/5873; C23C 14/588; C23C 16/45517; C23C 16/45587; C23C 16/4412; C23C 16/52; H01J 37/32834; H01J 37/32844; H01J 37/32642
USPC ............ 118/715; 156/345.1, 345.36, 345.35, 156/345.47, 345.48; 216/59
See application file for complete search history.

(56) References Cited

U.S. PATENT DOCUMENTS

2003/0227258 A1* 12/2003 Strang et al. ............. 315/111.21
2004/0108066 A1 6/2004 Hayami et al.

FOREIGN PATENT DOCUMENTS

JP 2001-196357 7/2001
(Continued)

OTHER PUBLICATIONS

"International Search Report", PCT Application No. PCT/US2010/047376, Mailing Date: Apr. 11, 2011.

(Continued)

*Primary Examiner* — Jeffrie R Lund
*Assistant Examiner* — Satish Chandra
(74) *Attorney, Agent, or Firm* — Beyer Law Group LLP

(57) ABSTRACT

An arrangement for performing pressure control within a processing chamber substrate processing is provided. The arrangement includes a peripheral ring configured at least for surrounding a confined chamber volume that is configured for sustaining a plasma for etching the substrate during substrate processing. The peripheral ring includes a plurality of slots that is configured at least for exhausting processed byproduct gas from the confined chamber volume during substrate processing. The arrangement also includes a conductive control ring that is positioned next to the peripheral ring and is configured to include plurality of slots. The pressure control is achieved by moving the conductive control ring relative to the peripheral ring such that a first slot on the peripheral ring and a second slot on the conductive control ring are offset with respect to one another in a range of zero offset to full offset.

14 Claims, 3 Drawing Sheets

(56) References Cited

FOREIGN PATENT DOCUMENTS

| JP | 2004-342703 | * | 12/2004 |
| JP | 2008-306212 | | 12/2008 |
| KR | 10-1998-0070700 | | 10/1998 |
| KR | 2002-0004623 | * | 1/2002 |

OTHER PUBLICATIONS

"Written Opinion", PCT Application No. PCT/US2010/047376, Mailing Date: Apr. 11, 2011.
"Internationai Preliminary Report on Patentability", PCT Application No. PCT/US2010/047376, Mailing Date: Mar. 15, 2012.

* cited by examiner

LOCAL PLASMA CONFINEMENT AND PRESSURE CONTROL ARRANGEMENT AND METHODS THEREOF

PRIORITY CLAIM

This application is related to and claims priority under 35 U.S.C. §119(e) to a commonly assigned provisional patent application entitled "A Local Plasma Confinement And Pressure Control Arrangement and Methods Thereof," by Dhindsa et al., application Ser. No. 61/238,665, filed on Aug. 31, 2009, which is incorporated by reference herein.

CROSS REFERENCE TO RELATED APPLICATIONS

The present invention is related to the following applications, all of which are incorporated herein by reference:

Commonly assigned application entitled "A Multiple Peripheral Ring Arrangement for Performing Plasma Confinement," filed on even date herewith by Dhindsa et al. herein, which claims priority under 35 U.S.C. §119(e) to a commonly assigned provisional patent application entitled "A Multiple Peripheral Ring Arrangement for Performing Plasma Confinement," by Dhindsa et al., application Ser. No. 61/238,656, filed on Aug. 31, 2009, which is incorporated by reference herein.

BACKGROUND OF THE INVENTION

Advances in plasma processing have provided for growth in the semiconductor industry. In today competitive market, a manufacturing company needs to be able to minimize waste and produce high quality semiconductor devices. Accordingly, tight control of the process parameters is generally needed to achieve satisfactory results during substrate processing.

Within a processing chamber, gas may interact with a radio frequency (RF) current to form plasma during substrate processing. In order to control plasma formation and to protect the processing chamber walls, the plasma may be confined to a limited chamber volume, such as the region within a peripheral ring. To exhaust the neutral gas species from the confinement region (the volume within the peripheral ring), the peripheral ring may include a plurality of slots. Each slot has a geometry that is configured to be large enough to allow the neutral gas species to exit the confinement region and flow toward the turbo pump by traversing through the slots. Generally, to be effective in confining the plasma within the confinement area, each slot tends to have a cross-sectional of less than two times the plasma sheath. As discussed herein, plasma sheath can exist on each side of the slots. Hence if the total sheath thickness greater than the slot width, there won't be any bulk plasma in between the sheath hence plasma successfully pinch of by slots. However if the slot width greater than the tow times the sheath thickness then the plasma can exist inside the slots.

Those skilled in the art are aware that each recipe/recipe step may require a certain pressure volume/level to be maintained in order to generate the desired plasma needed during substrate processing. However, during substrate processing, certain conditions (e.g., chamber conditions) may cause the pressure volume/level to fluctuate. To control the pressure volume/level, a vacuum valve that is positioned downstream from the confinement region but upstream from the turbo pump may be employed. In an example, to increase the pressure volume/level, the vacuum valve may be tightened.

Unfortunately, as the pressure increases, the plasma sheath tends to collapse and the size of the plasma sheath may become smaller. In some circumstances, the cross-sectional size of each slot may become larger than twice the size of the shrinking plasma sheath. Given that the plasma sheath has shrunk, the slots may no longer be able to confine the plasma within the confinement region. As a result, plasma may traverse through the slots and be formed outside of the confinement region. This is especially true given that the tightening of the vacuum valve not only increases the pressure volume/level within the confinement region but also the pressure volume/level in the outside chamber volume (the region outside of the confinement region). Thus, the high-pressurized environment of the outside chamber volume may be conducive for unconfined plasma formation.

Accordingly, an arrangement for pressure control while restricting plasma formation within the region formed by the peripheral ring is desirable.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
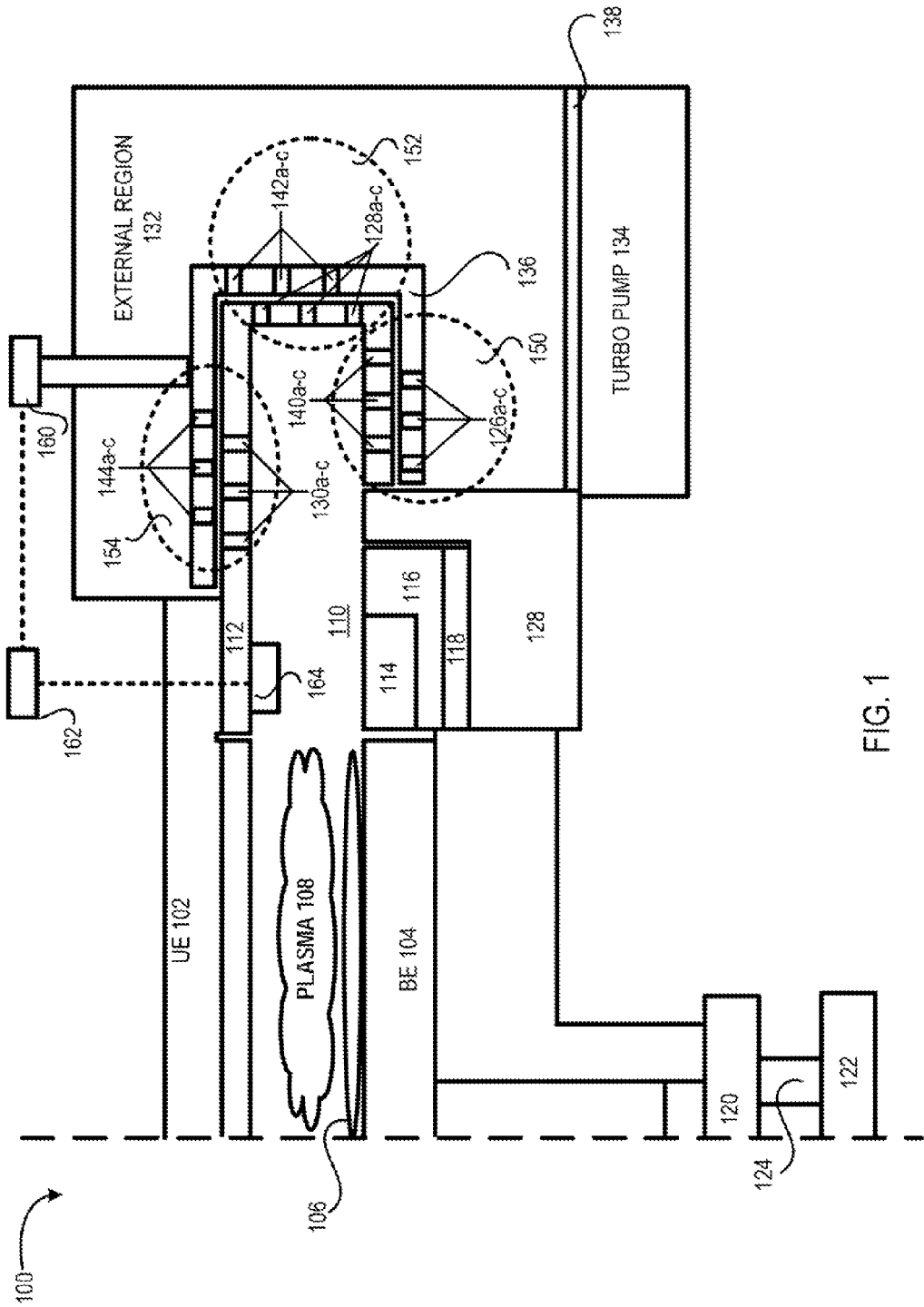
FIG. 1 shows, in an embodiment of the invention, a simple diagram of a partial view of a processing chamber with a local pressure control and plasma confinement arrangement.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, in the prior art, pressure control is provided by adjusting a vacuum valve. Since the vacuum valve tends to be positioned away from the confinement region, the adjustment of the vacuum valve not only changes the pressure volume/level within the confinement region but also tends to change the pressure volume/level outside of the peripheral ring. In one aspect of the invention, the inventors herein realized that local control is required to adjust the pressure volume/level within the peripheral ring without changing the pressure volume/level outside of the confinement region.

In accordance with embodiments of the present invention, an arrangement for pressure control while confining plasma within a region formed by a peripheral ring is provided. Embodiments of the invention include a local pressure control and plasma confinement arrangement. Embodiments of the invention also include an automatic feedback arrangement and methods thereof for managing the local pressure control and plasma confinement arrangement.

In an embodiment of the invention, a local pressure control and plasma confinement arrangement is provided within a processing chamber of a plasma processing system. In an embodiment, the local pressure control and plasma confinement arrangement may be implemented within a capacitively-coupled plasma (CCP) processing system. The local pressure control and plasma confinement arrangement includes a fixed peripheral ring and at least one movable conductive control ring, in an embodiment. Although more than one movable conductive control ring may be employed to control the size of the opening for exhausting gas from the confinement region, cost consideration and physical space limitation may render the implementation of more than one movable conductive control ring for each peripheral ring as less economically and/or physically feasible.

In this document, various implementations may be discussed using a single peripheral ring as an example. This invention, however, is not limited to a single peripheral ring and may be applied to a plasma processing system with one or more peripheral rings. Instead, the discussions are meant as examples and the invention is not limited by the examples presented.

In an embodiment, the conductive control ring may be positioned either within or outside of the confinement region (confinement region refers to the periphery surrounded by the peripheral ring). The conductive control ring is positioned next to the peripheral ring. As discussed herein, the term "next to" may refer to but are not limited to nested inside and out, nested within one another, adjacent, separated by a small gap, and the like. In a preferred embodiment, the conductive control ring surrounds the peripheral ring. In other words, the conductive control ring is positioned closer to the outside chamber volume, thereby providing a barrier against the possibility of plasma unconfinement.

The peripheral ring may have a plurality of slots (may be fixed-sized or variable-sized). In an embodiment, the number of slots and the positioning of the slots on the conductive control ring may vary. In an embodiment, the number of slots and the positioning of the slots on the conductive control ring may match the number of slots and the positioning of the slots on the peripheral ring. In another embodiment, the number of slots and/or positioning of the slots on the conductive control ring may differ from that of the peripheral ring. To control pressure within the confinement region, the conductive control ring may be actuated/moved/rotated relative to the peripheral ring to manipulate the opening of each slot on the peripheral ring.

In an embodiment, a motor (such as a stepper motor) may be employed to actuate and/or rotate the conductive control ring. During substrate processing, the motor may move the conductive control ring to control the slot size of the peripheral ring. In an example, the given size of the slots on the peripheral ring may be available for exhausting processed byproduct gas (such as neutral gas species) by setting the position of each slot on the conductive control ring to match the position of each slot on the peripheral ring. However, to reduce the size of the slots on the peripheral ring, the conductive control ring may be moved so that the slots on the peripheral ring are offset by the slots on the conductive control ring.

In an embodiment, the offset may be in a range of zero offset to full offset. As discussed herein, zero offset refers to a situation in which at least a first slot on the peripheral ring matches with a first slot on the conductive control ring to provide an unblock passage for the exhausting gas. As discussed herein, a full offset may refers to a situation in which at least one slot on the peripheral ring is covered by a slot on the conductive control ring such that the passage for exhausting gas is blocked. As can be appreciated from the foregoing, the offset relationship between the peripheral ring and the conductive control ring may also include a partial offset such that at least a portion of the passage for exhausting gas is available.

Those skilled in the art are aware that the production environment is usually a dynamic environment. During substrate processing, the pressure volume/level may fluctuate. In an embodiment, the local pressure control and plasma confinement arrangement is configured to provide local pressure control for the confinement region. By adjusting the conductive control ring, local pressure control may be performed. In an example, to increase the pressure volume/level within the confinement ring, the conductive control ring may be actuated/rotated relative to the peripheral ring so that the size of each slot on the peripheral ring is reduced, thereby increasing the pressure within the confinement region without increasing the pressure in the outside chamber volume.

In an embodiment, the local pressure control and plasma confinement arrangement is configured to confine the plasma within the confinement region. In an example, due to chamber conditions, the slots on the peripheral ring have become greater than two times the size of the plasma sheath. In the prior art, the collapse of the plasma sheath may enable the plasma to traverse through the slot into the outside chamber volume. However, by manipulating the movable conductive control ring, the slots on the peripheral ring may remain smaller than two times the size of the plasma. In other words, by rotating/actuating the movable conductive control ring, the conductive control ring may offset the opening of each slot on the peripheral ring, thereby effectively reducing the size of the slots and substantially preventing the plasma from leaking into the outside chamber volume.

In an embodiment of the invention, the local pressure control and plasma confinement arrangement is an automatic feedback arrangement in which a sensor may be employed to monitor the pressure volume/level within the confinement region. The data collected by the sensor may be sent to a control module, which may include a process module controller, for analysis. The pressure data may be compared to a predetermined threshold range. If the pressure volume/level is outside of the threshold range, instructions may be sent to the motor to actuate/rotate the conductive control ring to change the pressure volume/level locally within the confinement region.

By providing an arrangement for performing pressure control, the pressure volume/level may be adjusted within the confined chamber volume of the peripheral ring without affecting the pressure volume/level in the outside chamber volume (area outside of the confinement region). With local pressure control, a stable plasma above the substrate may be maintained during substrate processing while restricting the plasma from traversing through the slots of the peripheral ring to form outside of the confinement region. In addition, the automatic feedback feature of the arrangement enables pressure control and/or plasma confinement to occur automatically without human intervention.

The features and advantages of the present invention may be better understood with reference to the figures and discussions that follow.

FIG. 1 shows, in an embodiment of the invention, a simple diagram of a partial view of a processing chamber 100 with a local pressure control and plasma confinement arrangement. Consider the situation wherein, for example, a substrate 106 is being processed within processing chamber 100. In an embodiment, processing chamber 100 may be a capacitively-coupled plasma processing chamber. Substrate 106 may be positioned above a bottom electrode 104. During substrate processing, a plasma 108, which may be employed to etch substrate 106, may form between substrate 106 and an upper electrode 102.

In order to control plasma formation and to protect the processing chamber walls, a peripheral ring 112 may be employed. Peripheral ring 112 may be made of a conductive material such as silicon, polysilicon, silicon carbide, boron carbide, ceramic, aluminum, and the like. Usually, peripheral ring 112 may be configured to surround the periphery of a confined chamber volume 110 in which plasma 108 is to form. In addition to peripheral ring 112, the periphery of confined chamber volume 110 may also be defined by upper electrode 102, bottom electrode 104, an edge ring 114, insulator rings 116 and 118, and chamber support structure 128.

During substrate processing, gas may flow from a gas distribution system (not shown) into confined chamber volume 110 to interact with RF current to create plasma 108. RF current may be flowing from an RF source 122 to bottom electrode 104 via a cable 124 and a RF match 120. Those skilled in the art are aware that some of the chamber components (such as the upper electrode, the bottom electrode, the insulator rings, the edge ring, the chamber support, and the like) may have other configuration than that shown. Also, the number of RF sources and RF matches may also vary depending upon the plasma processing system.

In order to exhaust the processed byproduct gas (such as neutral gas species) from the confinement region (confined chamber volume 110), peripheral ring 112 may include a plurality of slots (such as slots 140a, 140b, 140c, 128a, 128b, 128c, 130a, 130b, and 130c). The processed byproduct gas (such as neutral gas species) may traverse from confined chamber volume 110 into an external region 132 (outside chamber volume) of processing chamber 100 before being pumped out of processing chamber 100 via a turbo pump 134.

The slots on peripheral ring 112 may have a radial shape, although other configurations may be employed. Each slot geometry is configured to be large enough to allow the processed byproduct gas (such as neutral gas species) to exit confined chamber volume 110. The number of slots and the size of the slots may depend upon the desired rate of conductance for the processing chamber. However, each slot usually has a cross-sectional of less than two times the plasma sheath (not shown).

Those skilled in the art are aware that processing chamber 100 has a dynamic environment. As a result, the pressure volume/level may fluctuate during substrate processing. As aforementioned, a vacuum valve 138 may be employed, in the prior art, to perform pressure control. However, in certain conditions, such as when vacuum valve 138 is tightened, the higher pressure volume/level may cause the plasma sheath (not shown) to collapse. As the plasma sheath collapses, the cross-sectional of the slots on peripheral ring 112 may become larger than twice the size of the shrinking plasma sheath. As a result, plasma may become unconfined and may traverse through the slots and escape into external region 132 of processing chamber 100. Since the change in the pressure volume/level is not localized within confined chamber volume 110, external region 132 (outside chamber volume) of processing chamber 100 may now have a high-pressurized environment that is conducive to plasma formation.

Since tight control of process parameters, such as the pressure volume/level, is generally required to produce quality semiconductor devices, an arrangement and/or method is needed to control the pressure volume/level within confined chamber volume 110. In an embodiment, a conductive control ring 136 may be employed to provide local pressure control. In an embodiment, conductive control ring 136 may be positioned next to peripheral ring 112. As discussed herein, the term "next to" may refer to but are not limited to nested inside and out, nested within one another, adjacent, separated by a small gap, and the like. For example, conductive control ring 136 may be made from a dielectric material and may be positioned adjacent to peripheral ring 112. In another example, conductive control ring 136 may surround peripheral ring 112 such that conductive control ring 136 may be employed to block plasma from confined chamber volume 110 to flow into external region 132 of processing chamber 100.

In an embodiment, the number of slots (126a, 126b, 126c, 142a, 142b, 142c, 144a, 144b, and 144c) on conductive control ring 136 may match the number of slots (126a, 126b, 126c, 128a, 128b, 128c, 130a, 130b, and 130c) on peripheral ring 112. In another embodiment, the number of slots may not match. For example, the number of slots on conductive control ring 136 may be greater than the number of slots on peripheral ring 112. By actuating/rotating conductive control ring 136, the degrees of offset between the slots of conductive control ring 136 and the slots of peripheral ring 112 may be manipulated to provide local pressure control. As can be appreciated from the foregoing, the degree of offset for each slot on peripheral ring 112 may vary depending upon the number of slots and/or the positioning of the slots on the conductive control ring.

Figure 2A:
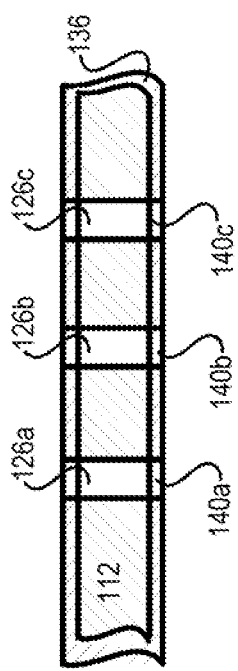
FIGS. 2A, 2B, and 2C show, in embodiments of the invention, examples or the different degrees of offset that may be employed to perform localized pressure control.

FIG. 2A shows, in an embodiment of the invention, a partial view of a local pressure control and plasma confinement arrangement with a zero degree of offset (200). In an embodiment, conductive control ring 136 surrounds peripheral ring 112 and the slots (140a, 140b, and 140c) of conductive control ring 136 is positioned directly underneath the slots (126a, 126b, and 126c) of peripheral ring 112. In this configuration, the slots (126a, 126b, and 126c) of peripheral ring 112 are of maximum size. In other words, the slots (126a, 126b, and 126c) of peripheral ring 112 are of the same size as if conductive control ring 136 is sustainable non-existence. This configuration may be desirable when the plasma sheath has not shrunk and the possibility of plasma non-confinement is remote.

Figure 2B:
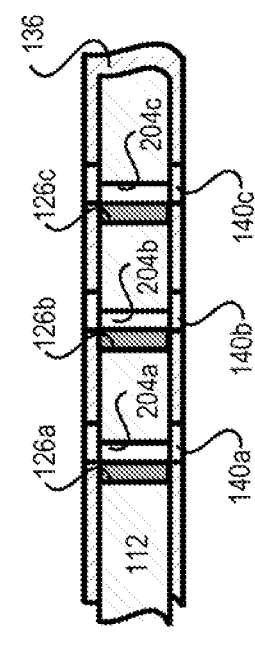

However, during substrate processing, conditions within confined chamber volume may change. In an example, the pressure volume/level may have fallen outside of an acceptable threshold range during substrate processing. To perform pressure control, conductive control ring 136 may be adjusted to cause the slots (140a, 140b, and 140c) on conductive control ring 136 to overlap corresponding slots (126a, 126b, and 126c) on peripheral ring 112 (as shown in arrangement 210 of FIG. 2B). In other words, the actuation/rotation of conductive control ring 136 may transform the slots (126a, 126b, and 126c) into a plurality of variable-sized slots (as shown by slots 204a, 204b, and 204c).

Under certain conditions (such as in a high-pressurized environment), the thickness of the plasma sheath may shrink causing the size of the slots (126a, 126b, and 126c) on peripheral ring 112 to become larger than twice the size of the collapsing plasma sheath. In an embodiment, by actuating/rotating conductive control ring 136, the geometry (e.g., size) of slots (126a, 126b, and 126c) on peripheral ring 112 may be offset, thereby reducing the openings into external region 136 (as shown by smaller openings 204a-c).

Figure 2C:
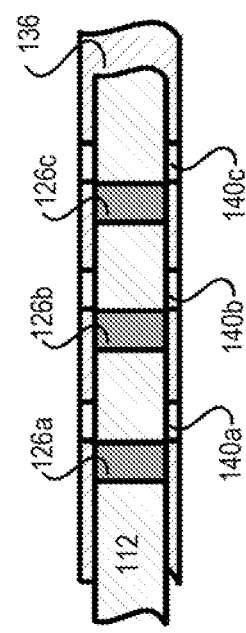

In an embodiment, the rate of conductance of exhausting the processed byproduct gas (such as neutral gas species) from the confined chamber volume may be reduced to sustainably zero if an especially high pressure volume/level is required within the confined chamber volume. To create the high pressure environment, conductive control ring 136 may be manipulated to close off the openings of the slots (126a, 126b, and 126c) of peripheral ring 112. In other words, a 100 percent degree of offset may be established by positioning each slot (140a, 140b, and 140c) on conductive control ring 136 next to a corresponding slot (126a, 126b, and 126c) on peripheral ring 112 (as shown in arrangement 220 of FIG. 2C).

Referring back to FIG. 1, although a backward c-shaped local pressure control and plasma confinement arrangement is shown, the local pressure control and plasma confinement arrangement may have other configurations. Those skilled in the art are aware that the rate of conductance may vary in each processing chamber. In a chamber that have a normal rate of conductance, slots may only be positioned either in sections 150, 152, or 154. In an example, if a bottom exhaust is required, the slots (126a, 126b, and 126c) may be positioned in section 150. Since slots are only positioned in section 150, only the slots (140a, 140b, and 140c) of conductive control ring 136 may be required to perform local pressure control.

In another embodiment, the local pressure control and plasma confinement arrangement may include two sections for performing localized pressure control. In an example, for a processing chamber with a need for a higher conductance rate for exhausting gas, sections 150 and 152, for example, may have slots (126a, 126b, 126c, 128a, 128b, and 128c) available for exhausting the processed byproduct gas (such as neutral gas species). Similar to the aforementioned example, corresponding slots (140a, 140b, 140c, 142a, 142b, and 142c) on conductive control ring 136 may be employed to perform pressure control.

In yet another embodiment of the invention, the backward c-shaped local pressure control and plasma confinement arrangement may be employed in a processing chamber that requires an especially high conductance rate. As can be appreciated from the foregoing, all three sections (150, 152, and 154) may be employed to perform pressure control for a processing chamber with a c-shaped configuration.

Figure 3:
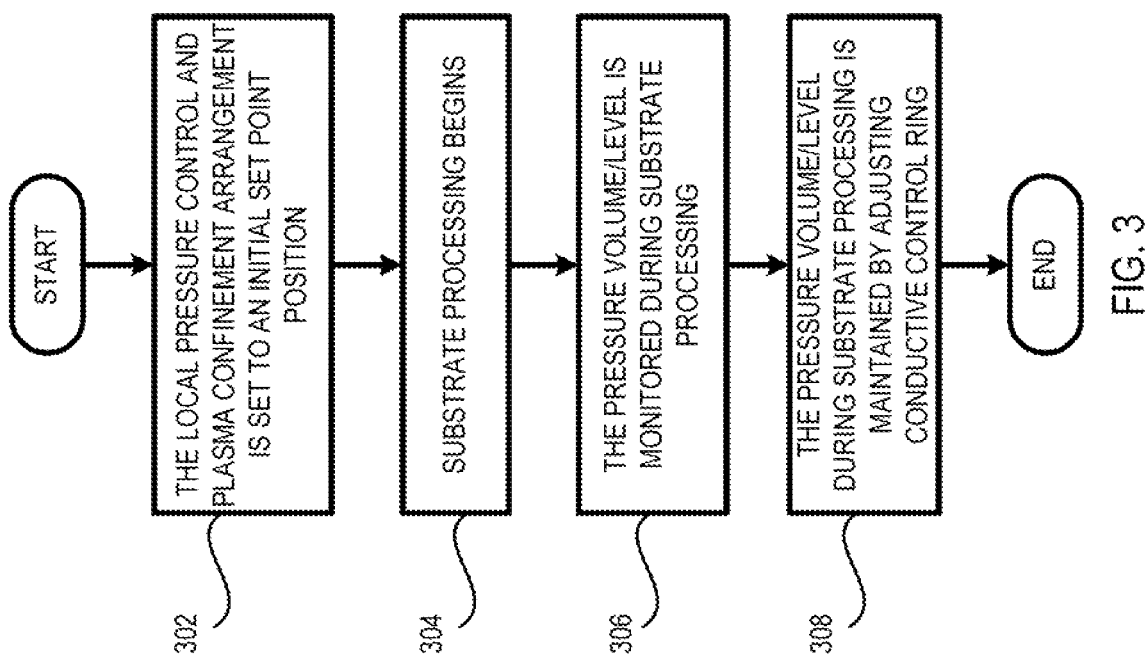
FIG. 3 shows, in an embodiment of the invention, a simple flow chart illustrating a method for automatically performing localized pressure control and plasma confinement.

In an embodiment of the invention, the local pressure control and plasma confinement arrangement is an automatic feedback arrangement. FIG. 3 shows, in an embodiment of the invention, a simple flow chart illustrating a method for automatically performing local pressure control and plasma confinement. FIG. 3 is discussed in relation to FIGS. 1, 2A, 2B, and 2C.

At a first step 302, the local pressure control and plasma confinement arrangement is set to an initial set point position.

In an example, conductive control ring 136 is moved to an initial set point position such that the slots of conductive control ring 136 is stacked below the slots of peripheral ring 112 (as shown in FIG. 2A). In an embodiment of the invention, a position module, such as an encoder (not shown), may be employed to record the initial set position of conductive control ring 136 and the initial set position may be sent to a control module 162 (such as a process module controller).

At a next step 304, substrate processing begins. Those skilled in the art are aware that a recipe may be entered. The recipe may define the requirements for the different process parameters, including the pressure parameter. During production, the recipe, as entered, is employed to process the substrate.

At a next step 306, the pressure volume/level is monitored during substrate processing. In an embodiment, a sensor 164 may be employed to monitor the pressure level within confined chamber volume 110. The process data about the pressure may be sent to control module 162 for analysis.

At a next step 308, the pressure volume/level during substrate processing is maintained by adjusting conductive control ring 136. Since control module 162 is continuously collecting pressure data, control module 162 is able to determine when the pressure volume/level within confined chamber volume 110 falls outside of an acceptable threshold range. Once a problem is identified, control module 162 may recalculate the new set point position to bring the pressure volume/level within the acceptable threshold value. The new set position may be calculated based on the current set point position.

In an embodiment, control module 162 may send a set of instructions to a motor 160, which is configured to actuate/rotate conductive control ring 136. In an embodiment, the set of instructions for moving the conductive control ring may include a direction signal and a step signal. In an example, the instruction received by the motor may indicate that conductive control ring 136 is to be moved toward a left direction by two stepper pulses (the step signal for a stepper motor is usually expressed as number of stepper pulses).

Upon receiving the set of instructions, motor 160 may actuate/rotate conductive control ring 136 to the desired position, thereby changing the size of the opening of each slot on peripheral ring 112. Accordingly, adjusting the size of the opening of each slot changes the rate of conductance, thereby providing local pressure control without affecting the pressure volume/level in the outside chamber volume.

Manipulating conductive control ring 136 is also an effective arrangement for confining plasma even if the pressure control is also being performed by another component, such as vacuum valve 138, instead of conductive control ring 136. In an example, my adjusting vacuum valve 138, the pressure volume/level has increased in processing chamber 100 (including confined chamber volume 110 and external region 132). In this example, conductive control ring 136 may be employed to reduce the openings of the slots on peripheral ring 112 as the plasma sheath begins to collapse.

Steps 304 through 308 are iterative steps and may be repeated during substrate processing.

As can be appreciated from the forgoing, one or more embodiments of the present invention provide for a local pressure control and plasma confinement arrangement. By providing a local pressure control arrangement, change in the pressure volume/level is confined to the chamber volume within the peripheral ring. Since pressure control is localized, the plasma employed for etching the substrate is stabilized at a quicker rate. Additionally, or alternatively, the local pressure control and plasma confinement arrangement provides a wider processing window since the arrangement is configured to substantially eliminate the possibility of plasma being established in the outside chamber volume. Thus, the local pressure control and plasma confinement arrangement minimizes the cost of ownership by protecting the chamber components from unconfined plasma development.

While this invention has been described in terms of several preferred embodiments, there are alterations, permutations, and equivalents, which fall within the scope of this invention. Although various examples are provided herein, it is intended that these examples be illustrative and not limiting with respect to the invention. In addition, even though the invention is described in relation to a capacitively-coupled plasma (CCP) processing system, the invention may also be applied in relation to an inductively-coupled plasma processing system or a hybrid plasma processing system.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An arrangement for performing pressure control within a processing chamber of a plasma processing system during processing of a substrate, said processing chamber including a chamber wall, comprising:
   a peripheral ring configured at least for surrounding a confined chamber volume, said peripheral ring including a peripheral ring vertical structure that is disposed inward of said chamber wall such that said confined chamber volume does not extend to said chamber wall, wherein said confined chamber volume is capable of sustaining a plasma for etching said substrate during substrate processing, said peripheral ring including a first plurality of slots, wherein said first plurality of slots is configured at least for exhausting processed byproduct gas from said confined chamber volume during said substrate processing; and
   a conductive control ring, wherein said conductive control ring is positioned next to said peripheral ring, wherein said peripheral ring is nested inside said conductive control ring such that said conductive control ring surrounds said peripheral ring, said conductive control ring includes a second plurality of slots, wherein each of said peripheral ring and said conductive ring comprises an upper portion, a side portion, and a lower portion wherein at least one of the upper portion, the side portion, and the lower portion of said peripheral ring comprises a first slot of said first plurality of slots and said conductive control ring comprises a second slot of said second plurality of slots, wherein said pressure control is achieved by moving said conductive control ring relative to said peripheral ring such that said first slot of said first plurality of slots of said peripheral ring and said second slot of said second plurality of slots of said conductive control ring are offset with respect to one another in a range of zero offset to full offset.

2. The arrangement of claim 1 further including a motor, wherein said motor is configured to move said conductive control ring to perform said pressure control.

3. The arrangement of claim 2 further including a set of sensors having at least one sensor configured for collecting processing data about pressure volume within said confined chamber volume.

4. The arrangement of claim 3 further including a control module configured at least for
   receiving said processing data from said set of sensors,
   analyzing said processing data,
   determining a new position for said conductive control ring, and
   sending said new position as part of a set of instructions to said motor.

5. The arrangement of claim 4 wherein said motor is configured to receive said set of instructions and to move said conductive control ring to adjust said pressure volume within said confined chamber volume.

6. The arrangement of claim 1 wherein said conductive control ring is made from a dielectric material.

7. The arrangement of claim 1 wherein said plasma processing system is a capacitively-coupled plasma processing system.

8. A plasma confinement arrangement within a processing chamber of a plasma processing system during processing of a substrate, comprising:
   a peripheral ring with a first set of slots, wherein said peripheral ring surrounds a confined chamber volume capable of sustaining a plasma during substrate processing, said peripheral ring including a peripheral ring horizontal structure that is disposed above a plane defined by said substrate, said first set of slots being configured for at least exhausting processed byproduct gas from said confined chamber volume during said substrate processing;
   a conductive control ring with a second set of slots, said conductive control ring includes a conductive control ring horizontal structure that is positioned next to said peripheral ring horizontal structure;
   wherein said peripheral ring is nested inside said conductive control ring such that said conductive control ring surrounds said peripheral ring;
   wherein each of said peripheral ring and said conductive ring comprises an upper portion, a side portion, and a lower portion wherein at least one of the upper portion, the side portion, and the lower portion of said peripheral ring comprises a first slot of said first set of slots and said conductive control ring comprises a second slot of said second set of slots; and
   a motor configured at least for moving said control ring relative to said peripheral ring such that a first slot said first set of slots of said peripheral ring and a second slot of said second set of slots of said control ring are offset with respect to one another in a range of zero offset to full offset.

9. The plasma confinement arrangement of claim 8 further including a set of sensors having at least one sensor configured for collecting processing data within said confined chamber volume.

10. The plasma confinement arrangement of claim 9 further including a control module configured for at least
   receiving said processing data from said set of sensors,
   analyzing said processing data,
   determining a new position for said conductive control ring, and sending said new position as part of a set of instructions to said motor.

11. The plasma confinement arrangement of claim 10 wherein said motor is configured to receive said set of instructions and to adjust said conductive control ring to maintain plasma confinement within said confined chamber volume.

12. The plasma confinement arrangement of claim 11 wherein said conductive control ring is made from a dielectric material.

13. The plasma confinement arrangement of claim 12 wherein said plasma processing system is a capacitively-coupled plasma processing system.

14. An arrangement for performing pressure control within a processing chamber of a plasma processing system during processing of a substrate, said processing chamber including a chamber wall, comprising:

a peripheral ring configured at least for surrounding a confined chamber volume, said peripheral ring including a peripheral ring vertical structure that is disposed inward of said chamber wall such that said confined chamber volume does not extend to said chamber wall, wherein said confined chamber volume is capable of sustaining a plasma for etching said substrate during substrate processing, said peripheral ring including a first plurality of slots, wherein said first plurality of slots is configured at least for exhausting processed byproduct gas from said confined chamber volume during said substrate processing; and a conductive control ring, wherein said conductive control ring is positioned next to said peripheral ring, said conductive control ring includes a conductive control ring vertical structure that is positioned next to said peripheral ring vertical structure, said conductive control ring includes a second plurality of slots, wherein said pressure control is achieved by moving said conductive control ring relative to said peripheral ring such that a first slot of said first plurality of slots of said peripheral ring and a second slot of said second plurality of slots of said conductive control ring are offset with respect to one another in a range of zero offset to full offset; wherein each of said peripheral ring and said conductive ring comprises a C-shaped exhaust plate having an upper plate, a side plate, and a lower plate wherein the upper plate, the side plate and the lower plate comprises a plurality of slots for exhausting processed byproduct gas from said confined chamber and wherein said conductive exhaust ring surrounds said peripheral exhaust ring.

* * * * *